United States Patent [19]

Tamaru et al.

[11] Patent Number: 4,985,297
[45] Date of Patent: Jan. 15, 1991

[54] COMPOSITE MATERIALS

[75] Inventors: Shinji Tamaru, Suita; Motonobu Kubo, Toyonaka; Osamu Tanaka, Suita; Tsutomu Kobayashi, Settsu, all of Japan

[73] Assignee: Daikin Industries, Inc., Osaka, Japan

[21] Appl. No.: 344,866

[22] Filed: Apr. 28, 1989

[30] Foreign Application Priority Data

Apr. 30, 1988 [JP] Japan ................................. 63-108042
May 6, 1988 [JP] Japan ................................. 63-111168

[51] Int. Cl.$^5$ ...................... D03D 25/00; B32B 15/08; D04H 1/00
[52] U.S. Cl. .................................... 428/260; 428/272; 428/290; 428/422; 428/458; 428/463; 428/473.5; 428/901
[58] Field of Search ..................... 428/473.5, 421, 422, 428/901, 260, 272, 290, 246, 458, 463; 528/185

[56] References Cited

U.S. PATENT DOCUMENTS 3,959,350  5/1976  Rogers ................................ 528/185
4,416,973 11/1983  Goff ................................... 430/281
4,822,853  4/1989  Uekita et al. ..................... 428/473.5

*Primary Examiner*—Thomas J. Herbert
*Attorney, Agent, or Firm*—Armstrong, Nikaido, Marmelstein, Kubovcik & Murray

[57] ABSTRACT

A laminate consisting essentially of a metal film or sheet and a film or sheet of a fluorine-containing polyimide (1), a composite sheet consisting essentially of a fluorohydrocarbon polymer substrate impregnated with a fluorine-containing polyimide (2), and a laminate consisting essentially of a metal film or sheet and the above composite sheet, the polyimide (1) and (2) being defined in the specification.

14 Claims, No Drawings

COMPOSITE MATERIALS

The present invention relates to composite materials comprising a fluorine-containing polyimide, and more particularly to laminates including a fluorine-containing polyimide film or sheet, films or sheets impregnated with a fluorine-containing polyimide, and laminates including such an impregnated film or sheet. These composite materials are useful, for example, for satellite broadcast receiving antenna circuit boards, satellite broadcast receiving converter circuit boards, circuit boards for radio communication devices, circuit boards for electric measuring instruments, circuit boards for high-speed computers, and circuit boards for high-frequency devices.

Heretofore known as printed wiring boards for use in electronic devices are, for example, rigid laminates such as the glass epoxy, paper phenolic, glass polyimide and glass polytetrafluoroethylene, and flexible boards of polyimide, polyester or the like.

Among these, the glass epoxy and the paper phenolic, although generally used, are great in dielectric constant and dielectric loss tangent, therefore result in a marked delay in propagating signals or great high-frequency transmission losses and are not suited for circuits for use with high-frequency waves or for use in computers which require a high-speed operation. The glass polyimide has high heat resistance and good dimensional stability, is used in the form of a multilayer laminate or the like, but is great in dielectric constant and dielectric loss tangent and therefore still remain to be improved for high-frequency use. The glass polytetrafluoroethylene, although low in dielectric constant and in dielectric loss tangent, is unstable in adhesion to copper foil or the like and in coefficient of expansion in the direction of thickness and is not satisfactorily processable, hence problems. Flexible boards have the feature of being amenable to wiring between parts and to three-dimensional wiring, but are great in dielectric constant and in dielectric loss tangent and are not satisfactorily usable for high-frequency circuits.

An object of the present invention is to provide composite materials suited for use with high-frequency waves, diminished in dielectric constant and dielectric loss tangent and excellent in high-frequency characteristics, heat resistance and dimensional stability.

The above and other objects of the invention will become apparent from the following description.

The present invention provides a laminate consisting essentially of a metal film or sheet and a film or sheet of a fluorine-containing polyimide represented by the formula (1).

The present invention provides a composite sheet consisting essentially of a fluorohydrocarbon polymer substrate impregnated with a fluorine-containing polyimide represented by the formula (2), and a laminate consisting essentially of a metal film or sheet and the above composite sheet.

The fluorine-containing polyimide (1) is represented by the formula (1)

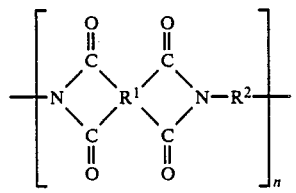

(1)

wherein $R^1$ is a residue obtained by removing two acid anhydride groups from an aromatic tetracarboxylic dianhydride, $R^2$ is a residue obtained by removing two amino groups from an aromatic diamine, at least one of $R^1$ and $R^2$ containing in the main chain a group represented by:

wherein

Rf: $C_{1-10}$ perfluoroalkyl,
Rf': $C_{1-20}$ perhaloalkyl, preferably $C_{4-15}$ perhaloalkyl
p: an integer of 1 to 3,
q: 0 or an integer of 1 to 3,
r: 0 or 1,
s: 0 or an integer of 1 to 5,
t: 0 or an integer of 1 of 5, and
Y: the same as X, or a hydrogen atom, $C_{1-8}$ alkyl or $C_{1-8}$ haloalkyl (halogen atom is fluorine, chlorine or bromine atom), and
n is an integer of 1 to 2,000.

The fluorine-containing polyimide (2) is same as the fluorine-containing polyimide (1) except for p is 0 or an integer of 1 to 3, and represented by the formula (2)

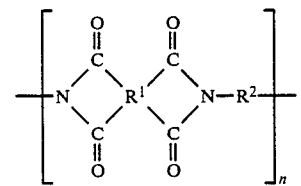

(2)

wherein $R^1$ is a residue obtained by removing two acid anhydride groups from an aromatic tetracarboxylic dianhydride, $R^2$ is a residue obtained by removing two amino groups from an aromatic diamine, at least one of $R^1$ and $R^2$ containing in the main chain a group represented by:

wherein

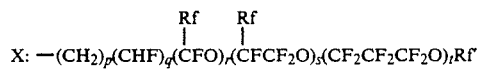

Rf: $C_{1-10}$ perfluoroalkyl,
Rf': $C_{1-20}$ perhaloalkyl,
p: 0 or an integer of 1 to 3,
q: 0 or an integer of 1 to 3,
r: 0 or 1,
s: 0 or an integer of 1 to 5,
t: 0 or an integer of 1 to 5, and
Y: the same as X, or a hydrogen atom, $C_{1-8}$ alkyl or $C_{1-8}$ haloalkyl (halogen atom is fluorine, chlorine or bromine atom), and
n is an integer of 1 to 2,000.

In the above, a preferred example of X is $CF_3$ group and $CH_2CH_2Rf'$ group, preferred examples of Y are $CF_3$ group, hydrogen atom, $C_{1-8}$ alkyl groups and $C_{1-8}$ haloalkyl groups, prefered example of Rf' is $C_{4-15}$ perhaloalkyl groups.

A specific example of $R^1$ is

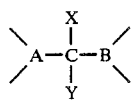 (G₁)

X and Y: as defined above
A and B: same or different, each being

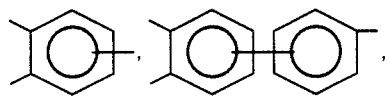

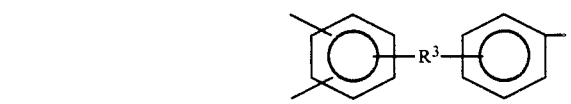

$R^3$: $-O-$, $-\overset{O}{\underset{\|}{C}}-$, $-(CH_2)_n-$, $n = 1\sim 5$, $SO_2-$, $-S-$,

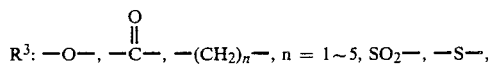

$R^4$: $C_{1-10}$ alkyl, aryl (such as phenyl or naphthyl), and substituted aryl (substituent example: $C_{1-5}$ alkyl)

Other examples of $R^1$ are as follows.

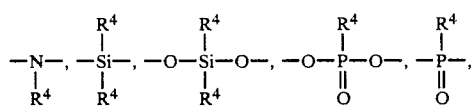

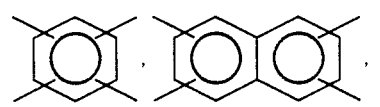 ($R^3$: as defined above),

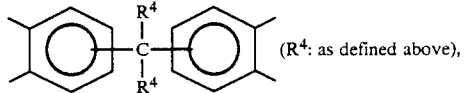 ($R^4$: as defined above),

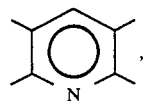

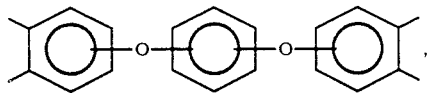

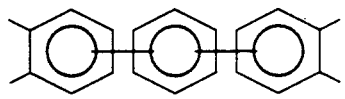

A specific example of $R^2$ is

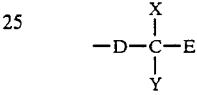 (G₂)

X and Y: as defined above
D and E: same or different, each being

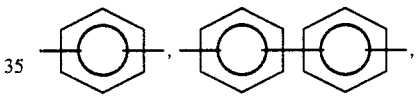

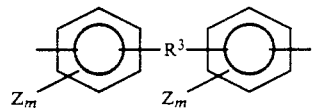

wherein $R^3$ is as defined above, Z's are the same or different and are each a hydrogen atom, Cl, Br or $NO_2$, and m is an integer of 1 to 4.

Other examples of $R^2$ are as follows.

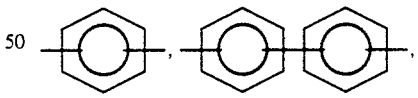

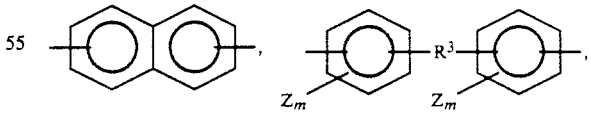

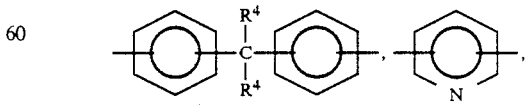

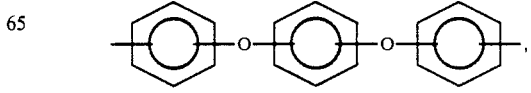

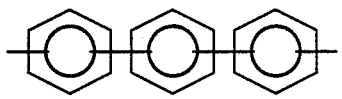

wherein $R^3$, $R^4$, Z and m are as defined above.

The polyimide (1) or (2) for use in the present invention can be prepared by reacting an aromatic tetracarboxylic dianhydride represented by the formula

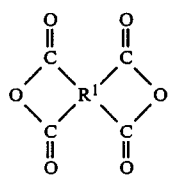

wherein $R^1$ is as defined above with an aromatic diamine represented by the formula $$H_2N-R^2-NH_2 \qquad (4)$$

wherein $R^2$ is as defined above to produce a polyamide-acid represented by the formula

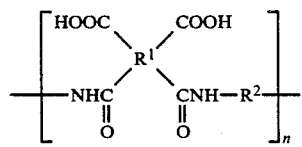

wherein $R^1$ and $R^2$ are as defined above, and n is an integer of 1 to 2,000, preferably 1 to 1,000, and converting the polyamide-acid to a polyimide.

Among the aromatic tetracarboxylic dianhydrides of the formula (3), those containing —(X)C(Y)— group can be prepared, for example, by reacting a compound represented by the formula $$XCOY \qquad (6)$$

wherein X and Y are as defined above with o-xylene in the presence of a Lewis acid to obtain a compound represented by the formula

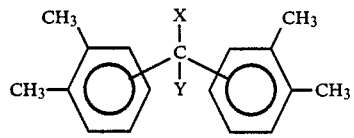

and oxidizing and dehydrating the compound.

Examples of compounds of the formula (6) are $$C_8F_{17}CH_2COCF_3$$

$$C_3F_7OC(CF_3)FCH_2CH_2COCF_3$$
$$C_4F_9CH_2CH_2COCF_3$$
$$C_8F_{17}CH_2CH_2COH$$
$$C_8F_{17}CH_2CH_2COCH_2CH_2CF_2CF_2(OCF_2CF_2CF_2)nF$$
$$(n = 1 \sim 5)$$
$$H(CF_2CF_2)_3CH_2CH_2COCF_3$$
$$H(CF_2CF_2)_3CH_2CH_2COCH_2CH_2C_8F_{17}$$

The compound represented by the formula (6) can be readily prepared, for example, by the following Grignard reaction.

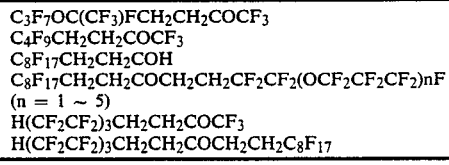

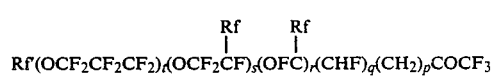

wherein Rf, Rf', p, q, r, s and t are as defined above.

The compound of the formula (6) is reacted with o-xylene in a ratio of at least 2 equivalents of the latter per equivalent of the former. Examples of useful Lewis acids are hydrogen fluoride, aluminum chloride, iron chloride (III), zinc chloride, boron trifluoride, $HSbF_6$, $HAsF_6$, $HPF_6$, $HBF_4$ and the like, among which hydrogen fluoride is especially preferable. The Lewis acid is used in 15 to 100 times, preferably 20 to 50 times, the amount in moles of the compound of the formula (6).

In conducting the reaction, it is desirable to use a solvent. Examples of solvents usable are dimethylformamide (DMF), hexamethylphosphoramide (HMPA), demethylacetamide (DMAc), N-methylpyrrolidone, 1,1,2,2-tetrachloro-1,2-difluoroethane, dimethyl sulfoxide (DMSO), tetrahydrofuran (THF) and the like. The hydrogen fluoride to be used as the Lewis acid is usable also as a solvent.

The reaction is conducted usually at a temperature of 50° to 200° C. preferably 70° to 150° C., at a pressure of usually 5 to 20 kg/cm², preferably 7 to 15 kg/cm². The reaction time, although variable with the reaction temperature or the like, is usually in the range of 1 to 24 hours.

The reaction product can be collected by a usual method, for example, subjecting the reaction mixture to extraction with trichlorotrifluoroethane, chloroform or the like, and distilling off the solvent from the extract.

The compound of the formula (7) obtained by the above reaction is oxidized usually with use of an oxidizing agent. Examples of preferable oxidizing agents are nitric acid, nitrous acid, chromic acid, permanganic acid, chloric acid and the like. The oxidation reaction is conducted at 140° to 200° C., preferably 170° to 190° C., with stirring. The reaction time is usually 0.5 to 10 hours, preferably 2 to 4 hours.

The oxidation reaction gives a compound represented by:

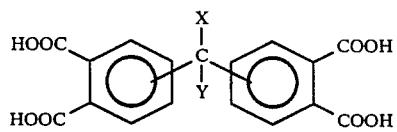

For dehydration, this compound is heated at 100° to 200° C., preferably 140° to 180° C., at a reduced pressure or in a nitrogen stream. The reduced pressure to be used is 10 to 200 mmHg, preferably 20 to 100 mmHg. Alternatively, the dehydration can be effected with use of a solvent, i.e., by dissolving the compound (8) in a solvent and heating the solution at the boiling point of the solvent used. Examples of useful solvents are xylene, chlorobenzene, toluene, n-octane, 1,1,1,2-tetrachloroethane, 1,1,2,2-tetrachloroethane and the like.

Typical examples of useful aromatic tetracarboxylic dianhydrides having the above-mentioned —(X)C(Y)— group are, for example, 2,2-bis(3,4-dicarboxyphenyl)-1,3-dichloro-1,1,3,3-tetrafluoropropane dianhydride, 2,2-bis-(3,4-dicarboxyphenyl)-1-chloro-1,1,3,3,3-pentafluoropropane dianhydride and compounds represented by the following formulae.

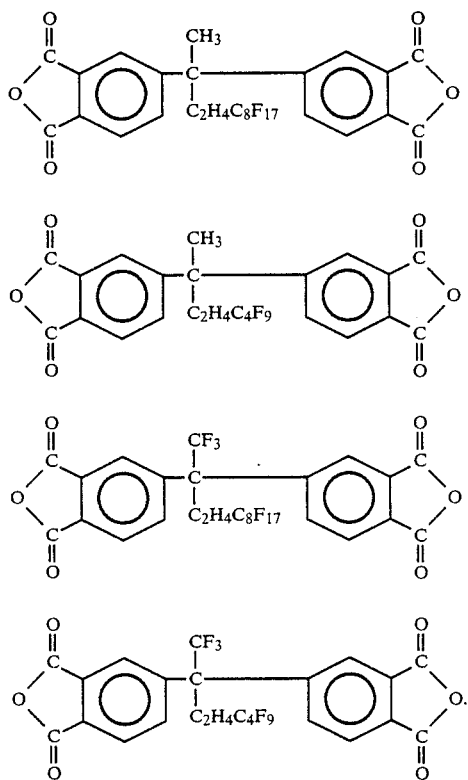

In the case of polyimides (2), 2,2-bis(3,4-dicarboxyphenyl)-hexafluoropropane dianhydride is also usable in addition to the above examples.

Among the aromatic diamines of the formula (4), those containing —(X)C(Y)— group can be prepared, for example, by reacting a compound of the formula (6) with toluene to obtain a compound represented by the formula

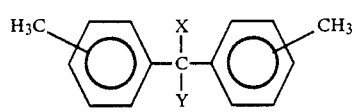

(9)

oxidizing the compound to obtain a dicarboxylic acid represented by the formula

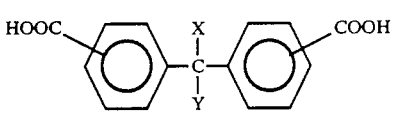

(10)

and reacting the acid with hydrazoic acid in the presence of a strong acid. The reactions for preparing the compound (9) and the compound (10) can be carried out in the same manner as in the case where o-xylene is used.

The hydrazoic acid is used preferably in an amount of 1 to 2 moles per mole of the compound of the formula (10). Examples of strong acids to be used are sulfuric acid, hydrochloric acid, nitric acid and the like. The strong acid is used in an amount of 20 to 50 equivalents per equivalent of the compound of the formula (10). The reaction is conducted with stirring at 40° to 60° C., preferably at 50° to 60° C., usually for 1 to 10 hours, preferably for 2 to 4 hours. It is desirable to effect the reaction in the presence of a solvent such as chloroform.

Typical examples of aromatic diamines containing the group —(X)C(Y)— are, for example, compounds represented by the following formulae

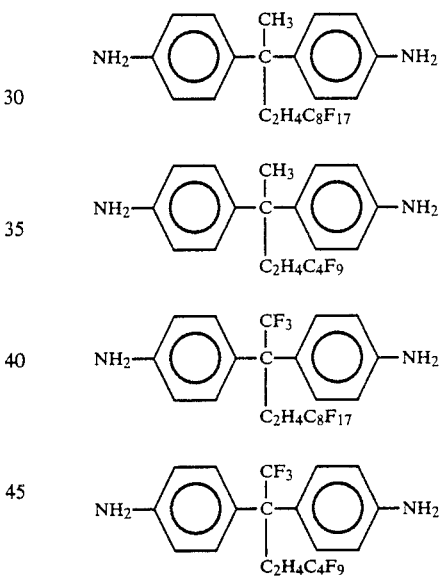

In the case of polyimides (2), also usable in addition to the above examples are 2,2-bis(4-aminophenyl)-hexafluoropropane, 2,2-bis(4-aminophenyl)-1,3-dichloro-1,1,3,3-tetrafluoropropane and 2,2-bis(4-aminophenyl)-1-chloro-1,1,3,3,3-pentafluoropropane.

Besides the aromatic tetracarboxylic dianhydrides containing a group of the formula (G$_1$) and the aromatic diamines containing a group of the formula (G$_2$), other aromatic tetracarboxylic dianhydrides and other aromatic diamines are usable in the present invention. In the case, the dianhydride and the diamine are used in such a combination that at least one of them contain the group —(X)C(Y)—.

Examples of other useful aromatic tetracarboxylic dianhydrides are pyromellitic dianhydride, 2,3,6,7-naphthalenetetracarboxylic dianhydride, 3,4,3',4'-diphenyl-tetracarboxylic dianhydride, 1,2,5,6-naphthalenetetracarboxylic dianhydride, 2,3,2',3'-diphenyltetracarboxylic dianhydride, 2,3,3',4'-diphenyltetracarboxylic dianhydride, 2,2-bis(3,4-dicarboxyphenyl)propane dianhydride, bis(3,4-dicarboxyphenyl)-sulfone dianhydride, 3,4,9,10-perylenetetracarboxylic dianhydride, bis(3,4-dicarboxyphenyl)ether dianhydride, naphthalene-1,4,5,8-tetracarboxylic dianhydride, 2,2-bis(2,3-dicarboxyphenyl)propane dianhydride, 1,1-bis(2,3-dicarboxy-phenyl)ethane dianhydride, 1,1-bis(3,4-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)methane dianhydride, bis(3,4-diacarboxyphenyl)-thioether dianhydride, 3,4,3',4'-benzophenonetetracarboxylic dianhydride, bis(3,4-dicarboxyphenyl)dimethylsilane dianhydride, bis(3,4-dicarboxyphenyl)diethylsilane dianhydride, bis(3,4-dicarboxyphenyl)diphenylsilane dianhydride, 2,2-bis(3,4-dicarboxyphenyl)-hexafluoropropane dianhydride, 2,2-bis(3,4-dicarboxyphenyl)-1,3-dichloro-1,1,3,3-tetrafluoropropane dianhydride, 2,2-bis(3,4-dicarboxyphenyl)-1-chloro-1,1,3,3,3-pentafluoropropane dianhydride and the like.

Examples of other useful aromatic diamines are 4,4'-diaminodiphenyl ether, 3,3'-diaminodiphenyl ether, 3,4'-diaminodiphenyl ether, 4,4'-diaminodiphenyl thioether, 3,3'-diaminodiphenyl thioether, 3,4'-diaminodiphenyl thioether, 4,4'-diaminobenzophenone, 3,3'-diaminobenzophenone, 3,4'-diaminobenzophenone, 4,4'-diaminodiphenylsulfone, 3,3'-diaminodiphenylsulfone, 3,4'-diaminodiphenylsulfone, 4,4'-diaminodiphenylmethane, 3,3'-diaminodiphenylmethane, 3,4'-diaminodiphenylmethane, 2,2'-bis(4-aminophenyl)propane, 2,2'-bis(3-aminophenyl)propane, benzidine, 3,3'-diaminobiphenyl, 3,4'-diaminobiphenyl, p-phenylenediamine, m-phenylenediamine, bis(4-aminophenyl)dimethylsilane, bis(4-aminophenyl)diethylsilane, bis(4-aminophenyl)diphenylsilane, 2,2-bis(4-aminophenyl)-hexafluoropropane, 2,2-bis(4-aminophenyl)-1,3-dichloro-1,1,3,3-tetrafluoropropane, 2,2-bis(4-aminophenyl)-1-chloro-1,1,3,3,3-pentafluoropropane and the like.

The fluorine-containing polyimide for use in the invention is prepared by mixing together equimolar amounts of the acid anhydride and the diamine with stirring usually in the presence of a solvent, and dehydrating the resulting polyamide-acid. The reaction between the acid anhydride and the diamine is carried out at a temperature of 0° to 60° C., preferably 20° to 40° C., for 1 to 24 hours, preferably for 3 to 12 hours. Examples of useful solvents are N-methyl-2-pyrrolidone (NMP), dimethylacetamide (DMAc), dimethylformamide (DMF), sulfolane, tetrahydrofuran (THF) and the like. In the case where the acid anhydride containing a group represented by the formula ($G_1$) is reacted with the aromatic diamine containing a group of the formula ($G_2$), it is desirable to use a mixture of one of the above solvent and a halogen solvent such as tetrachlorohexafluorobutane, trichlorotrifluoroethane, tetrachlorodifluoroethane or perchloroethylene. The polyamide-acid produced by the above reaction can be converted to a polyimide by a usual method. For example, the polyamide-acid can be readily converted to a polyimide by heating the acid at a temperature of at least 200° C., for example at 230° to 400° C., for dehydration.

The present invention provides as a first embodiment thereof a laminate comprising a film, sheet or the like of the polyimide (1) and a metal film or sheet formed thereon. Examples of metals for forming the metal film or sheet are copper, aluminum, nickel, iron, alloys of such metals, etc. The metal film or sheet can be produced, for example, by adhering a foil of such metal to the polyimide film or sheet with an adhesive, electroless plating, sputtering, vacuum evaporation or iron plating. The metal film or sheet is preferably about 5 to about 100 μm in thickness. According to the invention, the metal film or sheet can be formed on one surface or both surfaces of the polyimide film or sheet. Furthermore, a plurality of laminates of the type described, each comprising a metal film or sheet and a film or sheet of the polyimide (1), can be laminated into an assembly. In this case, the component laminates are so arranged that the metal films or sheets are held out of contact with each other. Furthermore, it is possible to laminate a plurality of polyimide films or sheets first and thereafter form a metal film or sheet over the resulting laminate.

Electric circuits can be formed on the laminates of the invention by a usual method as by etching for use as high-frequency printed boards.

The present invention further provides as another embodiment thereof a composite sheet which is prepared by impregnating a fluorohydrocarbon polymer substrate with a fluorine-containing polyimide (2).

Examples of useful fluorohydrocarbon polymer substrates are porous films or sheets, fiber fabrics, nonwoven fabrics, etc. of fluorohydrocarbon polymers such as polytetrafluoroethylene, polychlorotrifluoroethylene, tetrafluoroethylene-hexafluoropropylene coloplymer and tetrafluoroethylene-perfluorovinyl ether copolymer. These polymers are small in dielectric constant and dielectric loss tangent. For example, polytetrafluoroethylene is 2.05 in dielectric constant and 0.00002 (1 MHz) in dielectric loss tangent. The porous film or sheet has voids and therefore has a still smaller dielectric constant. When having a void volume of 30 to 90%, such a film or sheet is 1.8 to 1.1 in dielectric constant.

The fluorohydrocarbon polymer substrate can be impregnated with the fluorine-containing polyimide, for example, by dipping the substrate in a solution of the polyimide and drying the substrate, or by dipping the substrate in a solution of a precursor of the polyimide, i.e. polyamide-acid, drying the substrate and heating the substrate to dehydrate the acid for conversion to the imide. Examples of solvents useful for preparing the solution are N-methyl-2-pyrrolidone (NMP), dimethylacetamide (DMAc), dimethylformamide (DMF), sulfolane, tetrahydrofuran (THF) and the like. Also useful are mixtures of such a solvent and a halogen solvent such as tetrachlorohexafluorobutane, trichlorotrifluoroethane, tetrachlorodifluoroethane or perchloroethylene.

According to the invention, laminates can be prepared by forming a metal film or sheet on a composite sheet which is prepared by impregnating a fluorohydrocarbon polymer substrate with a fluorine-containing polyimide. When a precursor of the polyimide, i.e. polyamide-acid, is used for impregnation, the substrate is heated at a temperature of at least 200° C., e.g. 230° to 400° C., for imidation. Examples of metals for forming the metal film or sheet are copper, aluminum, nickel, iron, alloys of such metals, etc. The metal film or sheet can be produced, for example, by adhering a foil of such metal to the composite sheet with an adhesive, electroless plating, sputtering, vacuum evaporation or ion plating. The metal film or sheet is preferably about 5 to about 100 μm in thickness. According to the invention, the metal film or sheet can be formed on one surface or both surfaces of the composite sheet. Furthermore, a plurality of laminates, each comprising a metal film or sheet and a composite sheet of the type described, can be laminated into an assembly. In the case, the component laminates are so arranged that the metal films or sheets are held out of contact with each other. Furthermore, it is possible to laminate a plurality of composite sheets first and thereafter form a metal film or sheet over the resulting laminate.

Electric circuits can be formed on the laminates of the invention by a usual method as by etching for use as high-frequency printed boards. When the substrate is porous and impregnated with the fluorine-containing polyimide, voids remain in the interior, whereas the impregnating polyimide forms on the surface of the substrate a coating which prevents the etchant or the like from penetrating into the substrate.

According to the invention, composite materials which are excellent in heat resistance, dimensional stability and high-frequency characteristics and suited to high-frequency uses can be obtained by using fluorine-containing polyimides which are low in dielectric constant and dielectric loss tangent and which are obtained by introducing fluorine into heat-resistant dimensionally stable polyimides, or by using such polyimides and fluorohydrocarbon polymers which are also low in dielectric constant and dielectric loss tangent. The composite materials are therefore useful for fabricating high-frequency circuits such as high-frequency computation circuits and communication circuits.

The present invention will be described with reference to the following reference examples and examples.

REFERENCE EXAMPLE 1

A 24.31 g quantity (1 mole) of magnesium, 150 ml of dry diethyl ether and a small amount of iodine crystals were placed into a 5-liter four-necked flask equipped with condenser, theremometer, nitrogen introduction tube and stirrer and were stirred while introducing nitrogen into the flask. A solution of $C_8F_{17}CH_2CH_2$ I (574 g, 1 mole) in 600 ml of diethyl ether was slowly added dropwise to the mixture. The mixture was thereafter heated under reflux for 2 hours. The reaction mixture was then cooled to room temperature, $CF_3CO_2CH_3$ (128 g, 1 mole) was added dropwise thereto, and the mixture was thereafter stirred for 2 hours.

After the completion of the reaction, the reaction mixture was acidified with a sulfuric acid solution. The ethyl ether layer was washed with water three times and then dried over sodium sulfate and further over phosphorus pentoxide. The diethyl ether layer was distilled in a vacuum, giving 174 g (yield 32%) of a ketone compound represented by $C_8F_{17}CH_2CH_2COCF_3$ (boiling point 96°–98° C./17 mmHg).

IR(NaCl)γ[cm$^{-1}$]; 1780, 1250, 1210, 1150, 1010.

$^{19}$F-NMR(CCl$_4$)δ[ppm]; −12.7(s, 3F), 2.3(t, 3F), 35.9(broad, 2F), 43.2(broad, 6F), 44.0(broad, 2F), 44.3(broad, 2F), 47.5(broad, 2F).

REFERENCE EXAMPLE 2

Into 300-ml autoclave were placed 15.2 g (0.165 mole) of toluene, $C_8F_{17}CH_2CH_2COCF_3$ (40.9 g, 0.075 mole) obtained in Reference Example 1 and 40 ml of hydrogen fluoride. The mixture was then reacted with stirring at a temperature of 90° to 100° C. and pressure of 9 kg/cm$^2$ for 18 hours.

After the completion of the reaction, hydrogen fluoride was removed from the reaction product, which was then subjected to extraction with trichlorotrifluoroethane. The extract was distilled in a vacuum to remove the ethane, giving 38.9 g (yield 73%) of a compound represented by the formula

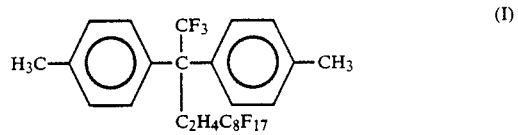

IR(NaCl)γ[cm$^{-1}$]; 2900, 1520, 1465, 1330, 1240, 1210, 1150, 1010, 815, 730, 710.

$^1$H-NMR(CCl$_4$/TMS)δ[ppm]; 1.5–3.3(m, 4H), 2.30(s, 6H), 7.05(s, 8H).

$^{19}$F-NMR(CCl$_4$/TFA)δ[ppm]; −12.1(s, 3F), 2.8(t, 3F), 36.3(broad, 2F), 43.5(broad, 6F), 44.4(broad, 2F), 44.7(broad, 2F), 47.9(broad, 2F).

REFERENCE EXAMPLE 3

The compound (20.0 g, 0.028 mole) of the formula (I) obtained in Reference Example 2 and 73 ml of acetic acid were placed into a 100-ml autoclave, and 18.3 g of chromium oxide (VI) was added to the mixture with heating at 80° C. and stirring. The mixture was maintained at a temperature of 80° to 90° C. with stirring for 12 hours.

After the completion of the reaction, the acetic acid was removed from the reaction mixture in a vacuum. The solid residue was dissolved with 400 ml of 5% sodium hydroxide solution, and the chromium oxide was filtered off from the solution. When the filtrate was acidified with an aqueous sulfuric acid solution, a white solid product separated out. The solid product, when filtered off and dried, gave 18.5 g (yield 86%) of a compound represented by the formula

IR(KBr)γ[cm$^{-1}$]; 3000, 1700, 1615, 1425, 1330, 1285, 1240, 1200, 1150, 1120, 1010, 855, 810, 780, 725, 710.

$^1$H-NMR(DMSO-d$_6$/TMS)δ[ppm]; 1.6–3.1(m, 4H), 7.57(dd, J=8 Hz, 57 Hz, 8H), 9.5–10.5(broad, 2H).

$^{19}$F-NMR(DMSO-d$_6$/TFA)δ[ppm]; −13.0(s, 3F), 2.1(t, 3F), 35.9(broad, 2F), 43.0(broad, 6F), 44.0(broad, 2F), 44.3(broad, 2F), 47.3(broad, 2F).

REFERENCE EXAMPLE 4

Into a 500-ml three-necked flask were placed 15.0 g (0.0195 mole) of the compound represented by the formula (II) and obtained in Reference Example 3, 63 g of concentrated sulfuric acid and 200 ml of chloroform. While heating the mixture at 40° to 50° C., 58.5 ml of hydrazoic acid (1.00N) was added dropwise to the mixture, followed by refluxing for 2 hours.

The mixture resulting from the reaction was cooled to room temperature and placed into 400 ml of water, whereby a precipitate was produced. The precipitate was filtered off, made alkaline with a solution of sodium hydroxide and subjected to extraction with 500 ml of chloroform. When distilled for the removal of the chloroform, the extract afforded 8.34 g (yield 60%) of a compound represented by the formula

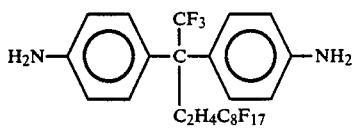
(III)

IR(KBr)γ[cm⁻¹]; 3450, 3370, 1630, 1520, 1370, 1335, 1280, 1250, 1230, 1200, 1150, 1110, 1005, 960, 825, 820, 705.

¹H-NMR(CDCl₃/TFA)δ[ppm]; 1.5-2.9(m, 4H), 3.62(s, 4H), 6.72(dd, J=8 Hz, 37 Hz, 8H).

¹⁹F-NMR(CDCl₃/TFA)δ[ppm]; −12.2(s, 3F), 2.1(t, 3F), 35.7(broad, 2F), 43.0(broad, 6F), 44.0(broad, 2F), 44.3(broad, 2F), 47.2(broad, 2F).

REFERENCE EXAMPLE 5

Into a 100-ml autoclave were placed 17.17 g (0.1617 mole) of o-xylene, C₈F₁₇CH₂CH₂COCF₃ (40.0 g, 0.0735 mole) and 37 ml of hydrogen fluoride. The mixture was then reacted with stirring at a temperature of 90° to 100° C. and at a pressure of 9 kg/cm² for 18 hours.

The mixture resulting from the reaction was subjected to extraction with trichlorotrifluoroethane. Removal of the trichlorotrifluoroethane from the extract in a vacuum, afforded 38.3 g (yield 70%) of a compound represented by the formula

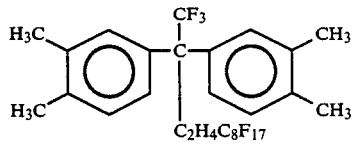
(IV)

IR(KBr)γ[cm⁻¹]; 2950, 1510, 1470, 1450, 1375, 1330, 1200, 1145, 1110, 1020, 990, 965, 880, 820, 735, 710.

¹H-NMR(CCl₄/TMS)δ[ppm]; 1.6-3.3(m, 4H), 2.22(s, 12H), 6.94(s, 6H).

REFERENCE EXAMPLE 6

Into a 500-ml autoclave were placed 38.0 g (0.05 mole) of the compound represented by the formula (IV) and obtained in Reference Example 5, 58 ml of 60% nitric acid and 57 ml of water, and the mixture was reacted at 170° to 180° C. for 2 hours.

After the completion of the reaction, the reaction mixture was filtered, and the solid cake obtained was dissolved with 5% sodium hydroxide solution, followed by filtration. The filtrate was acidified with an aqueous sulfuric acid solution and subjected to extraction with ether. Removal of the ether from the extract gave 39.7 g (yield 90%) of a compound represented by the formula

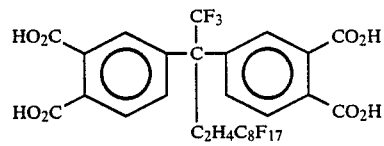
(V)

IR(KBr)γ[cm⁻¹]; 3400, 3000, 1710, 1615, 1580, 1510, 1425, 1210, 1160, 1110, 1070, 1020, 980, 820, 800, 725, 705.

¹H-NMR(acetone-d₆/TMS)δ[ppm]; 1.7-3.3(m, 4H), 6.6-7.6(broad, 4H), 7.6-8.0(m, 6H).

¹⁹F-NMR(acetone-d₆/TFA)δ[ppm]; −11.5(s, 3F), 3.6(t, 3F), 36.9(broad, 2F), 44.3(broad, 6F), 45.2(broad, 2F), 45.5(broad, 2F), 48.6(broad, 2F).

REFERENCE EXAMPLE 7

The compound (39.7 g, 0.046 mole) of the compound represented by the formula (V) and obtained in Reference Example 6 was placed into a 200-ml eggplant type flask and heated at 150° to 160° C. in a vacuum for 6 hours.

After heating, the reaction mixture was removed from the flask and recrystallized from ether, giving 22.7 g (yield 60%) of a compound in the form of white crystals and represented by the formula

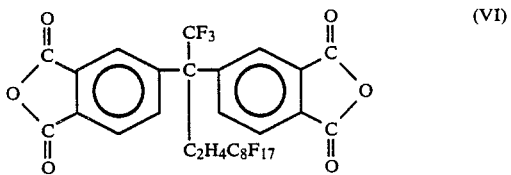
(VI)

IR(KBr)γ[cm⁻¹]; 1860, 1780, 1620, 1490, 1470, 1435, 1400, 1375, 1335, 1205, 1180, 1155, 1120, 1015, 900, 740, 725, 700.

¹H-NMR(hot CDCl₃/TMS)δ[ppm]; 1.6-3.2(m, 4H), 7.5-8.1(m, 6H).

¹⁹F-NMR(hot CDCl₃/TFA)δ[ppm]; −13.2(s, 3F), 2.1(t, 3F), 35.8(broad, 2F), 43.0(broad, 6F), 44.0(broad, 4F), 47.2(broad, 2F).

REFERENCE EXAMPLE 8

A 24.31 g quantity (1 mole) of magnesium, 150 ml of dry diethyl ether and a small amount of iodine crystals were placed into a 5-liter four-necked flask equipped with condenser, thermometer, nitrogen introduction tube and stirrer and were stirred while introducing nitrogen into the flask. A solution of C₄F₉CH₂CH₂I (374 g, 1 mole) in 600 ml of diethyl ether was slowly added dropwise to the mixture. The mixture was thereafter heated under reflux for 2 hours. The reaction mixture was then cooled to room temperature, CF₃CO₂CH₃ (128 g, 1 mole) was added dropwise thereto, and the mixture was thereafter stirred for 2 hours.

After the completion of the reaction, the reaction mixture was acidified with a sulfuric acid solution. The ethyl ether layer was washed with water three times and then dried over sodium sulfate and further over phosphorus pentoxide. The diethyl ether layer was distilled in a vacuum, giving 114 g (yield 33%) of a ketone compound represented by C₄F₉CH₂CH₂COCF₃ (boiling point 153°-155° C.).

REFERENCE EXAMPLE 9

Into 300-ml autoclave were placed 30.40 g (0.33 mole) of toluene, C₄F₉CH₂CH₂COCF₃ (50.62 g, 0.15 mole) obtained in Reference Example 8 and 75 g of hydrogen fluoride. The mixture was then reacted with stirring at a temperature of 85° to 90° C.

After the completion of the reaction, the reaction product was subjected to extraction with trichlorotrifluoroethane. The extract was distilled in a vacuum to remove the ethane, giving 42.6 g (yield 83%) of a compound represented by the formula

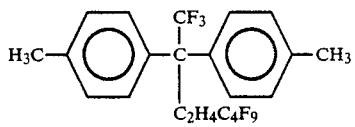 (VII)

IR(NaCl)γ[cm⁻¹]; 3000, 1615, 1520, 1465, 1350, 1225, 1135, 1010, 920, 880, 850, 810, 730.

¹H-NMR(CDCl₃/TMS)δ[ppm]; 1.7–2.9(m, 4H), 2.35(s, 6H), 7.17(s, 8H).

¹⁹F-NMR(CDCl₃)δ[ppm]; −12.3(s, 3F), 2.7(t, 3F), 36.4(m, 2F), 47.6(t, 2F).

REFERENCE EXAMPLE 10

The compound (52.5 g, 0.103 mole) of the formula (VII) obtained in Reference Example 9, 64 ml of 60% nitric acid and 63 ml of water were placed into a 300-ml autoclave, and the mixture was reacted at a temperature of 180° to 190° C. with stirring.

After the completion of the reaction, the insolubles were removed from the reaction mixture. The solid residue was dissolved with 200 ml of 5% sodium hydroxide solution, and the insolubles were filtered off from the solution. When the filtrate was acidified with an aqueous sulfuric acid solution, a white solid product separated out. The solid product, when filtered off and dried, gave 56.2 g (yield 96%) of a compound represented by the formula

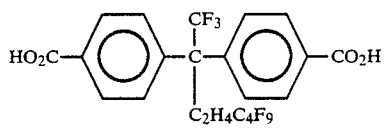 (VIII)

IR(KBr)γ[cm⁻¹]; 3000, 1615, 1520, 1465, 1350, 1225, 1135, 1010, 920, 880, 850, 810, 730.

¹H-NMR(CDCl₃/TMS)δ[ppm]; 1.7–2.9(m, 4H), 2.35(s, 6H), 7.17(s, 8H).

¹⁹F-NMR(CDCl₃)δ[ppm]; −12.3(s, 3F), 2.7(t, 3F), 36.4(m, 2F), 45.7(m, 2F), 47.6(t, 2F).

REFERENCE EXAMPLE 11

Into a 1-liter three-necked flask were placed 32.0 g (0.056 mole) of the compound represented by the formula (VII) and obtained in Reference Example 10, 88 g of concentrated nitric acid and 180 ml of chloroform. While maintaining the mixture at 0° to 5° C., 153 ml of hydrazoic acid (1.1N) was added dropwise to the mixture, followed by heating at 40° to 45° C. for 2 hours with stirring.

After stirring at room temperature for 12 hours, chloroform layer was separated from aqueous layer. The aqueous layer was made alkaline with sodium hydroxide and then extracted with 200 ml of chloroform. The extract was dried over sodium sulfate. When distilled for the removal of the chloroform and recrystallized from petroleum benzin-diethyl ether, the extract afforded 16.4 g (yield 54%) of a compound represented by the formula

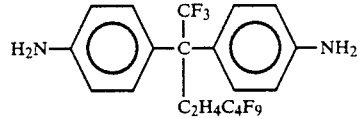 (IX)

IR(KBr)γ[cm⁻¹]; 3420, 3350, 1620, 1520, 1460, 1360, 1320, 1280, 1250, 1220, 1200, 1160, 1130, 1020, 1005, 920, 850, 835, 720.

¹H-NMR(DMSO-d₆)δ[ppm]; 1.5–3.8(m, 4H), 5.21(s, 4H), 6.74(dd, J=8 Hz, 36 Hz, 8H).

¹⁹F-NMR(DMSO-d₆)δ[ppm]; −12.6(s, 3F), 2.4(t, 3F), 35.9(m, 2F), 45.8(m, 2F), 47.5(t, 2F).

REFERENCE EXAMPLE 12

Into a 300-ml autoclave were placed 31.5 g (0.297 mole) of o-xylene, C₄F₉CH₂CH₂COCF₃ (46.5 g, 0.14 mole) and 70 g of hydrogen fluoride. The mixture was then reacted with stirring at a temperature of 75° to 80° C. for 17 hours.

The mixture resulting from the reaction was subjected to extraction with trichlorotrifluoroethane. Removal of the trichlorotrifluoroethane from the extract, afforded 65.5 g (yield 90%) of a compound represented by the formula

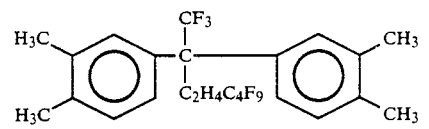 (X)

IR(NaCl)γ[cm⁻¹]; 2950, 1620, 1575, 1505, 1450, 1225, 1130, 990, 880, 810, 730, 720, 1015, 900, 740, 725, 700.

¹H-NMR(CCl₄)δ[ppm]; 1.6–3.9(m, 4H), 2.23(s, 12H), 7.00(s, 6H).

¹⁹F-NMR(CCl₄)δ[ppm]; −12.4(s, 3F), 2.9(t, 3F), 36.6(m, 2F), 45.9(m, 2F), 47.9(t, 3F).

REFERENCE EXAMPLE 13

Into a 300-ml autoclave were placed 40.4 g (0.075 mole) of the compound represented by the formula (X) and obtained in Reference Example 12, 83 ml of 60% nitric acid and 82 ml of water, and the mixture was reacted at 170° to 180° C. for 2 hours.

After the completion of the reaction, the reaction mixture was filtered, and the solid cake obtained was dissolved with 5% sodium hydroxide solution, followed by filtration. The filtrate was acidified with an aqueous sulfuric acid solution and subjected to extraction with ether. Removal of the ether from the extract gave 43.5 g (yield 88%) of a compound represented by the formula

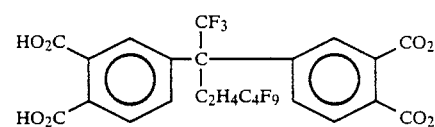 (XI)

IR(KBr)γ[cm⁻¹]; 3000, 1705, 1605, 1570, 1500, 1420, 1230, 1160, 1130, 1070, 1010, 880, 850, 800, 720.

¹H-NMR(DMSO-d₆) δ[ppm]; 1.8–3.8(m, 4H), 7.3–7.8(m, 6H), 10–12(broad, 4H).

$^{19}$F-NMR(DMSO-d$_6$) δ[ppm]; −13.2(s, 3F), 2.1(t, 3F), 35.3(m, 2F), 45.4(m, 2F), 47.2(t, 2F).

REFERENCE EXAMPLE 14

The compound (43.5 g, 0.66 mole) of the compound represented by the formula (XI) and obtained in Reference Example 13 was placed into a 200-ml eggplant type flask and heated at 160° C. in a vacuum for 5 hours.

After heating, the reaction mixture was removed from the flask and recrystallized from ether, giving 30.3 g (yield 65%) of a compound in the form of white crystals and represented by the formula

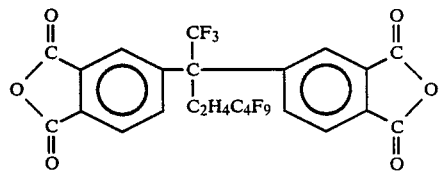

IR(KBr)γ[cm$^{-1}$]; 1860, 1785, 1620, 1430, 1330, 1255, 1235, 1175, 1150, 1130, 1115, 1010, 900, 850, 740, 720, 700.

$^1$H-NMR(DMSO-d$_6$) δ[ppm]; 1.5–3.6(m, 4H), 7.7–8.2(m, 6H), $^{19}$F-NMR(DMSO-d$_6$) δ[ppm]; −13.3(s, 3F), 2.3(t, 3F), 35.2(m, 2F), 45.2(m, 2F), 47.3(t, 2F).

EXAMPLE 1

The aromatic diamine (14.25 g, 0.02 mole) represented by the formula (III) was dissolved in a mixture of 35 g of N-methyl-2-pyrrolidone (NMP) and 65 g of tetrachlorohexafluorobutane, 16.45 g (0.02 mole) of the acid anhydride represented by the formula (VI) was slowly added to the solution, and the mixture was reacted at a temperature of 25° C. with stirring for 8 hours. The reaction gave a polyamide-acid having a viscosity of 14000 cps (23° C.) and a concentration of 23.5 wt. %. The polyamide-acid was applied to a stainless (SUS-316) panel and heated at 80° C. for 7 minutes, at 200° C. for 5 minutes and 300° C. for 10 minutes, whereby a polyimide film was obtained with a thickness of 50 μm. Both surfaces of the film were electrolessly plated with copper and thereafter electrically plated with copper to a thickness of 18 μm to obtain a laminate. The laminate was 2.6 in dielectric constant and 0.0020 in dielectric loss tangent (JISC 6481, 1 MHz).

EXAMPLE 2

A laminate was prepared in the same manner as in Example 1 with the exception of using 4.00 g (0.02 mole) of 4,4'-diaminodiphenyl ether as an aromatic diamine and replacing the solvent by 60 g of NMP. The laminate was 3.2 in dielectric constant and 0.0041 in dielectric loss tangent, as measured in the same manner as in Example 1.

EXAMPLE 3

A laminate was prepared in the same manner as in Example 1 with the exception of using 2.16 g (0.02 mole) of p-phenylenediamine as an aromatic diamine and replacing the solvent by 60 g of NMP and 12 g of tetrachlorohexafluorobutane. The laminate was 3.1 in dielectric constant and 0.0032 in dielectric loss tangent, as measured in the same manner as in Example 1.

EXAMPLE 4

A laminate was prepared in the same manner as in Example 1 with the exception of using 10.24 g (0.02 mole) of the compound of the formula (IX) as an aromatic diamine and 12.45 g (0.02 mole) of the compound of the formula (XII) as an aromatic tetracarboxylic dianhydride. The laminate was 2.92 in dielectric constant and 0.0029 in dielectric loss tangent, as measured in the same manner as in Example 1.

EXAMPLE 5

A laminate was prepared in the same manner as in Example 1 with the exception of using 4.00 g (0.02 mole) of 4,4'-diaminodiphenyl ether as an aromatic diamine, 12.45 g (0.02 mole) of the compound of the formula (XII) as an aromatic tetracarboxylic dianhydride and 60 g of N-methyl-2-pyrrolidine as a solvent. The laminate was 3.31 in dielectric constant and 0.0045 in dielectric loss tangent, as measured in the same manner as in Example 1.

EXAMPLE 6

A laminate was prepared in the same manner as in Example 1 with the exception of using 4.36 g (0.02 mole) of pyromellitic anhydride as an aromatic tetracarboxylic dianhydride and 60 g of N-methyl-2-pyrrolidone as a solvent. The laminate was 3.03 in dielectric constant and 0.0031 in dielectric loss tangent, as measured in the same manner as in Example 1.

EXAMPLE 7

A laminate was prepared in the same manner as in Example 1 with the exception of using 10.24 g (0.02 mole) of the compound of the formula (IX) as an aromatic diamine, 4.36 g (0.02 mole) of pyromellitic anhydride as an aromatic tetracarboxylic dianhydride and 60 g of N-methyl-2-pyrrolidone as a solvent. The laminate was 3.16 in dielectric constant and 0.0033 in dielectric loss tangent, as measured in the same manner as in Example 1.

EXAMPLE 8

A laminate was prepared in the same manner as in Example 1 with the exception of using 2.16 g (0.02 mole) of p-phenylenediamine as an aromatic diamine, 12.45 g (0.02 mole) of the compound of the formula (XII) as an aromatic tetracarboxylic dianhydride and 60 g of N-methyl-2-pyrrolidone as a solvent. The laminate was 3.25 in dielectric constant and 0.0042 in dielectric loss tangent, as measured in the same manner as in Example 1.

EXAMPLE 9

The same polyamide-acid as prepared in Example 1 was adjusted to a suitable viscosity with NMP and applied for impregnation to a porous polytetrafluoroethylene film (Zitex G 104, product of Norton Co., Ltd., U.S.A.), 0.1 mm in thickness and 55% in void volume. The impregnated film was dried at 150° C. and then heated at 300° C. for 20 minutes to imidate the acid and obtain a composite sheet. Eight such sheets were placed one over another in layers with a film of PFA (tetrafluoroethylene-perfluoro vinyl ether copolymer) interposed between the adjacent sheets, and 35 μm copper foil was placed over the top surface and bottom surface of the resulting assembly with a PFA film interposed therebetween. The assembly was held between heat plates and heat-pressed at a temperature of 330° C. and pressure of 40 kg/cm² for 10 minutes to obtain a laminate. The laminate was 2.18 in dielectric constant and 0.0009 in dielectric loss tangent.

EXAMPLE 10

A composite sheet was prepared in the same manner as in Example 9 with the exception of using 2.16 g (0.02 mole) of p-phenylene diamine as an aromatic diamine, a mixture of 55 g of NMP and 11 g of tetrachlorohexafluorobutane as a solvent and a nonwoven fabric of polytetrafluoroethylene short fiber (Polyflon Paper PA-5 L, product of Daikin Industries, Ltd., 0.55 mm in thickness, 75% in void volume) as a substrate. Using two such sheets, a laminate was prepared in the same manner as in Example 9. The laminate was 2.31 in dielectric constant and 0.0017 in dielectric loss tangent, as determined in the same manner as in Example 9.

EXAMPLE 11

A composite sheet was prepared in the same manner as in Example 9 with the exception of using 4.36 g (0.02 mole) of pyromellitic dianhydride as an aromatic tetracarboxylic acid, 60 g of NMP as a solvent and a nonwoven fabric of polytetrafluoroethylene short fiber/quartz short fiber (80:20 in weight ratio) blend, 0.5 mm in thickness and 60% in void volume, as the substrate. A laminate was prepared by placing 35-μm copper foil over the upper and lower surfaces of the composite sheet with a 12.5-μm PFT film interposed therebetween and heat-pressing the assembly at 330° C. and 40 kg/cm² for 10 minutes. The laminate was 2.52 in dielectric constant and 0.0015 in dielectric loss tangent, as measured in the same manner as in Example 9.

EXAMPLE 12

A composite sheet was prepared in the same manner as in Example 9 with the exception of using as a substrate a nonwoven fabric of polytetrafluoroethylene short fiber/aromatic polyamide short fiber (90:10 in weight ratio) blend, 0.5 mm in thickness and 60% in void volume. A laminate was prepared in the same manner as in Example 11 using the composite sheet. The laminate was 2.35 in dielectric constant and 0.0028 in dielectric loss tangent, as measured in the same manner as in Example 9.

EXAMPLE 13

A composite sheet was prepared in the same manner as in Example 9 with the exception of using 2.16 g (0.02 mole) of p-phenylenediamine as an aromatic diamine, a mixture of 55 g of NMP and 11 g of tetrachlorohexafluorobutane and a fabric of polytetrafluoroethylene long fiber (plain weave, weighing 196 g/m²) as a substrate. A laminate was formed in the same manner as in Example 11 using the composite sheet. When checked in the same manner as in Example 9, the laminate was 2.60 in dielectric constant and 0.0022 in dielectric loss tangent.

EXAMPLE 14

A composite sheet was prepared in the same manner as in Example 9 with the exception of using 4.36 g (0.02 mole) of pyromellitic dianhydride as an aromatic tetracarboxylic acid, 60 g of NMP as a solvent and a woven fabric of PFA long fiber/aromatic polyamide long fiber (90:10 in weight ratio) blend (plain weave, weighing 163 g/m²) as a substrate. A laminate was formed in the same manner as in Example 11 using the composite sheet. The laminate was 2.61 in dielectric constant and 0.0033 in dielectric loss tangent when checked in the same manner as in Example 9.

EXAMPLE 15

A composite sheet was prepared by dissolving in NMP a fluorine-containing polyimide having the following repeating unit, adjusting the solution to a suitable viscosity, impregnating the same porous polytetrafluoroethylene film as used in Example 9 with the solution and drying the film at 200° C. A laminate was formed in the same manner as in Example 9 using the composite sheet. The laminate was 2.20 in dielectric constant and 0.0010 in dielectric loss tangent.

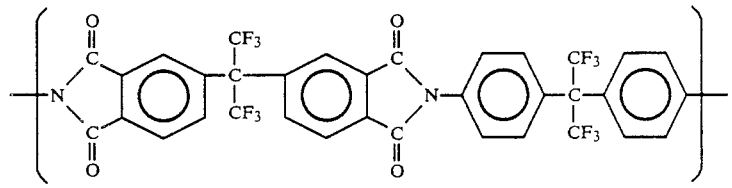

EXAMPLE 16

A composite sheet was prepared by dissolving in NMP a fluorine-containing polyimide having the following repeating unit, adjusting the solution to a suitable viscosity, impregnating the same polytetrafluoroethylene nonwoven fabric as used in Example 10 with the solution and drying the fabric at 200° C. A laminate was formed in the same manner as in Example 11 using the composite sheet. The laminate was 2.21 in dielectric constant and 0.0013 in dielectric loss tangent.

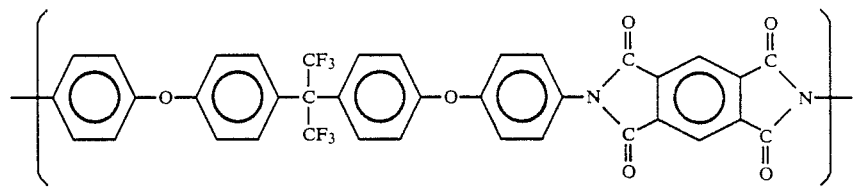

EXAMPLE 17

A composite sheet was prepared by dissolving in NMP a fluorine-containing polyimide having the structure given below, adjusting the solution to a suitable viscosity, impregnating the same nonwoven fabric of polytetrafluoroethylene short fiber/quartz short fiber blend as used in Example 11 with the solution and drying the fabric. A laminate with copper foil was prepared in the same manner as in Example 11 using the composite sheet. The laminate was 2.40 in dielectric constant and 0.0012 in dielectric loss tangent.

3. A laminate consisting essentially of a metal film or sheet and a film or sheet of a fluorine-containing polyimide represented by the formula (1):

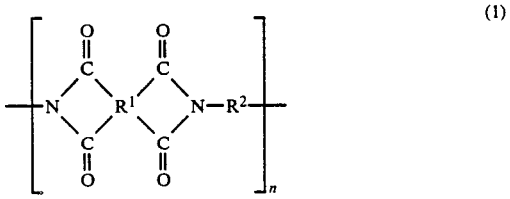
(1)

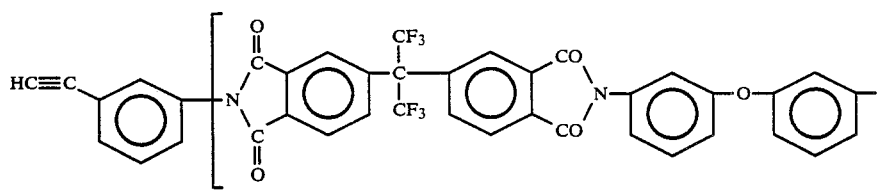

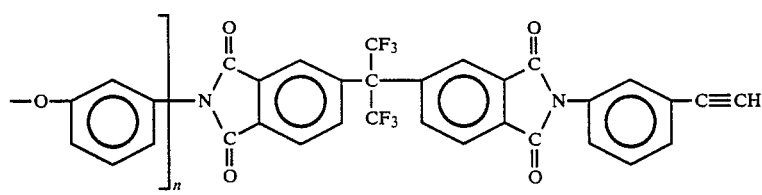

We claims:

1. A composite sheet consisting essentially of a fluorohydrocarbon polymer substrate impregnated with a fluorine-containing polyimide represented by the formula (2).

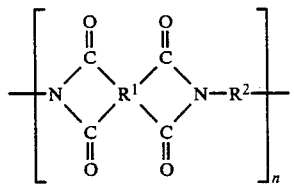
(2)

wherein $R^1$ is a residue obtained by removing two acid anhydride groups from an aromatic tetracarboxylic dianhydride, $R_2$ is a residue obtained by removing two amino groups from an aromatic diamine, at least one of $R_1$ and $R_2$ containing in the main chain a group represented by:

wherein X is —(CH$_2$)pRf'
Rf' is $C_{1-20}$ perhaloalkyl,
p is 0 or an integer of 1 to 3,
Y is the same as X, a hydrogen atom, $C_{1-8}$ alkyl or $C_1$ haloalkyl, and
n is an integer of 1 to 2,000.

2. A composite sheet as defined in claim 1, wherein the fluorohydrocarbon polymer substrate is a porous film or sheet, fiber fabric or nonwoven fabric of a fluorohydrocarbon polymer.

wherein $R^1$ is a residue obtained by removing two acid anhydride groups from an aromatic tetracarboxylic dianhydride, $R^2$ is a residue obtained by removing two amino groups from an aromatic diamine, at least one of $R^1$ and $R^2$ containing in the main chain a group represented by:

wherein X is —(CH$_2$)pRf'
Rf' is $C_{4-15}$ perhaloalkyl,
p is an integer of 1 to 3,
Y is the same as X, a hydrogen atom, $C_{1-8}$ alkyl or $C_1$ haloalkyl, and
n is an integer of 1 to 2,000.

4. A laminate as defined in claim 3, wherein the metal film or sheet is formed on one surface of the film or sheet of the fluorine-containing polyimide.

5. A laminate as defined in claim 3, wherein the metal film or sheet is formed on both surfaces of the film or sheet of the fluorine-containing polyimide.

6. A laminate consisting essentially of a plurality of laminates as defined in claim 3.

7. A laminate consisting essentially of a metal film or sheet and a composite sheet consisting essentially of a fluorohydrocarbon polymer substrate impregnated with a fluorine-containing polyimide represented by the formula (2):

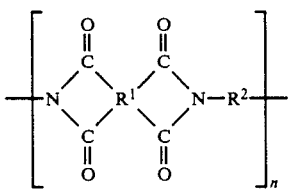 (2)

wherein R¹ is a residue obtained by removing two acid anhydride groups from an aromatic tetracarboxylic dianhydride, R² is a residue obtained by removing two amino groups from an aromatic diamine, at least one of R¹ and R² containing in the main chain a group represented by:

wherein
X is —(CH$_2$)pRf'
Rf' is C$_{1-20}$ perhaloalkyl,
p is 0 or an integer of 1 to 3,
Y is the same as X, a hydrogen atom, C$_{1-8}$ alkyl or C$_1$ haloalkyl, and
n is an integer of 1 to 2,000.

8. A laminate as defined in claim 7, wherein the metal film or sheet is formed on one surface of the composite sheet.

9. A laminate as defined in claim 7, wherein the metal sheet or film is formed on both surfaces of the composite sheet.

10. A laminate consisting essentially of a plurality of laminates as defined in claim 7.

11. A laminate as defined in claim 7, wherein the fluorohydrocarbon polymer substrate is a porous film or sheet, fiber fabric or nonwoven fabric of a fluorohydrocarbon polymer.

12. A laminate as defined in claim 11, wherein the metal film or sheet is formed on one surface of the composite sheet.

13. A laminate as defined in claim 11, wherein the metal film or sheet is formed on both surfaces of the composite sheet.

14. A laminate consisting essentially of a plurality of laminates as defined in claim 11.

* * * * *

UNITED STATES PATENT AND TRADEMARK OFFICE
CERTIFICATE OF CORRECTION

PATENT NO.   : 4,985,297
DATED        : January 15, 1991
INVENTOR(S)  : TAMARU et al It is certified that error appears in the above-identified patent and that said Letters Patent is hereby corrected as shown below:

On the title page, Item [73], "Daikin Industries, Inc." should read --Daikin Industries, Ltd.--.

Signed and Sealed this

Eighth Day of September, 1992

Attest:

DOUGLAS B. COMER

Attesting Officer

Acting Commissioner of Patents and Trademarks